United States Patent [19]

Rodriguez et al.

[11] Patent Number: 5,900,047
[45] Date of Patent: May 4, 1999

[54] EXHAUST SYSTEM FOR A SEMICONDUCTOR ETCHER THAT UTILIZES CORROSIVE GAS

[75] Inventors: Benjamin G. Rodriguez; Augusto J. Gonzales, both of San Antonio; Robert E. Fritz, Jr., Lakehills; Freddy Meyers, Castroville, all of Tex.

[73] Assignees: Sony Corporation; Sony Electronics, both of Tokyo, Japan

[21] Appl. No.: 08/979,426

[22] Filed: Nov. 26, 1997

[51] Int. Cl.$^6$ .................................................. B01D 47/00
[52] U.S. Cl. ........................... 96/243; 55/385.2; 55/413; 55/419; 454/187; 438/905; 438/909
[58] Field of Search .............................. 55/385.1, 385.2, 55/DIG. 18, 319, 419, 413; 95/149; 96/243; 454/187; 438/905, 909

[56] References Cited

U.S. PATENT DOCUMENTS

| | | | |
|---|---|---|---|
| 4,014,658 | 3/1977 | Arendson et al. | 23/292 |
| 4,312,291 | 1/1982 | Knab | 118/50 |
| 4,319,899 | 3/1982 | Marsh | 55/416 |
| 4,512,245 | 4/1985 | Goldman | 98/115.4 |
| 4,690,042 | 9/1987 | Bertelsen et al. | 98/115.1 |
| 4,880,581 | 11/1989 | Dastoli et al. | 55/385.2 |
| 4,910,042 | 3/1990 | Hokynar | 427/38 |
| 4,927,438 | 5/1990 | Mears et al. | 55/385 |
| 4,987,673 | 1/1991 | Kogura et al. | 29/564 |
| 5,089,441 | 2/1992 | Moslehi | 438/909 |
| 5,095,942 | 3/1992 | Murphy | 137/561 |
| 5,096,477 | 3/1992 | Shinoda et al. | 55/385.2 |
| 5,145,303 | 9/1992 | Clarke | 454/187 |
| 5,181,819 | 1/1993 | Sakarta et al. | 55/385.2 |
| 5,327,624 | 7/1994 | Hirayama | 438/909 |
| 5,338,248 | 8/1994 | Sumrack | 454/49 |
| 5,344,615 | 9/1994 | Yanagi et al. | 55/385.2 |
| 5,415,585 | 5/1995 | Miyagi | 454/187 |
| 5,431,599 | 7/1995 | Genco | 454/187 |
| 5,464,475 | 11/1995 | Sikes et al. | 454/187 |
| 5,567,149 | 10/1996 | Hansotte, Jr. et al. | 432/6 |
| 5,584,959 | 12/1996 | Kimura et al. | 55/385.1 |
| 5,584,963 | 12/1996 | Takahashi | 438/905 |
| 5,616,208 | 4/1997 | Lee | 438/905 |
| 5,674,123 | 10/1997 | Roberson, Jr. et al. | 454/187 |
| 5,681,219 | 10/1997 | LeFevre et al. | 454/187 |
| 5,728,602 | 3/1998 | Bellows et al. | 438/909 |
| 5,785,796 | 7/1998 | Lee | 438/905 |
| 5,788,747 | 8/1998 | Horiuchi et al. | 55/385.1 |
| 5,810,656 | 9/1998 | Dowdell et al. | 454/187 |

Primary Examiner—Duane S. Smith
Attorney, Agent, or Firm—Wagner,Murabito&Hao

[57] ABSTRACT

An exhaust system for a semiconductor etcher that utilizes corrosive gas. Specifically, the present invention exhausts residual corrosive gas from the exit load lock compartment of a semiconductor etcher. For instance, at the completion of the etching process of semiconductor wafers, the exit load lock compartment of an etcher contains the etched wafers along with residual corrosive gas. When the exit load lock compartment pressure returns to about 1 atmosphere, the residual corrosive gas begins to escape. Within an embodiment of the present invention, an exhaust box is adjacently located to the exit load lock compartment to exhaust the residual corrosive gas from it. The exhaust box is a specifically shaped hollow box that has an intake slot and an exhaust aperture. Two edges that partly form the intake slot are parallel to the outer side edge of the exit load lock compartment when its door is open. The intake slot length matches the outer side edge length of the exit load lock compartment. An exhaust blower provides a suction that draws the residual corrosive gas from the exit load lock compartment through the intake slot, through the interior of the exhaust box, through the exhaust aperture, through an exhaust pipe and outside of the clean room where the etcher is located. In so doing, the present invention substantially removes the residual corrosive gas from the exit load lock compartment, thereby preventing it from slowly corroding the components of the semiconductor etcher.

20 Claims, 6 Drawing Sheets ly within a clean room of the residual corrosive gas escaping from the exit load lock compartment of a semiconductor etcher. The present invention provides this advantage.

EXHAUST SYSTEM FOR A SEMICONDUCTOR ETCHER THAT UTILIZES CORROSIVE GAS

TECHNICAL FIELD

The present invention relates to the field of manufacturing semiconductor wafers. More specifically, the present invention relates to the field of semiconductor etchers.

BACKGROUND ART

Manufacturing semiconductor wafers involves several different technical procedures to produce a finished product. Included within these several different procedures is the process of etching the semiconductor wafers. In order to etch the semiconductor wafers, the wafers are first loaded into an entrance load lock compartment of a semiconductor etcher. Mechanical devices within the etcher remove the semiconductor wafers from the entrance load lock compartment to eventually etch them using a corrosive gas. When the etcher has completed etching the wafers, they are moved into the exit load lock compartment of the etcher. The exit load lock compartment door is then opened in order to remove the etched semiconductor wafers from the exit load lock compartment. While the exit load lock door is opened, residual corrosive gas unfortunately escapes into the clean room where the exit load lock compartment is located.

The escaping residual corrosive gas from the exit load lock compartment of the etcher into the clean room causes several unwanted problems. Since the clean room utilizes laminar flow to keep the air within the room clean, the residual corrosive gas escaping from the exit load lock is dispersed throughout the room and particularly is blown downward by the laminar flow. Specifically, the residual corrosive gas is blown underneath and behind portions of the semiconductor etcher and is blown and forced in contact with components of the etcher which include: mechanical components; electronic relays; and other electronic components. In essence, any exposed metal components contacted by the escaping residual corrosive gas becomes oxidized (e.g., corrodes).

Since some of the metal mechanical and electrical components of the semiconductor etcher are slowly being corroded by the escaping residual corrosive gas, the need continually arises on a regular basis to replace the corroded components with new costly components. Routinely purchasing and installing new mechanical and electrical replacement components for semiconductor etchers is costly to a semiconductor manufacturer. In addition to the cost of purchasing and installing the replacement components, there is also the downtime cost to the manufacturer while the etcher is not operating because the replacement components are being installed.

One prior art solution to prevent the escape of residual corrosive gas from the exit load lock compartment during the removal of semiconductor wafers is to open and close the exit load lock door as quickly as possible. There are several problems associated with this prior art solution. The main problem with this prior art solution is that it is very ineffective in preventing the escape of residual corrosive gas from the exit load lock compartment. For instance, when the exit load lock door is opened and closed quickly, about 90% of the residual corrosive gas escapes from the exit load lock compartment as soon as the door is opened. Furthermore, another problem with this prior art solution is that an operator is needed to perform the task of closing the exit load lock door as quickly as possible. Using an operator to perform this task is very impractical because it is desirable to have automatic semiconductor processes as much as possible to reduce the number of required technicians to keep costs competitive.

Therefore, it would be advantageous to provide a system that prevents the dispersion within a clean room of the residual corrosive gas escaping from the exit load lock compartment of a semiconductor etcher. The present invention provides this advantage.

DISCLOSURE OF THE INVENTION

The present invention includes a system to exhaust residual corrosive gas from the exit load lock compartment of a semiconductor etcher. For instance, at the completion of the etching process of semiconductor wafers, the exit load lock compartment of an etcher that is located within a clean room contains the etched wafers along with residual corrosive gas. When the exit load lock compartment pressure returns to about 1 atmosphere, the residual corrosive gas begins to escape.

Within an embodiment of the present invention, an exhaust box is adjacently located to the exit load lock compartment to exhaust the residual corrosive gas from it. The exhaust box is a specifically shaped hollow box that has an intake slot and an exhaust aperture. Two edges that partly form the intake slot of the present invention are parallel to the outer side edge of the exit load lock compartment when its door is open. The intake slot length matches the outer side edge length of the exit load lock compartment. An exhaust blower provides a suction that draws the residual corrosive gas from the exit load lock compartment through the intake slot, through the interior of the exhaust box and through the exhaust aperture. In one embodiment the exhaust blower is connected to a facility exhaust system pipe, which is connected to an exhaust pipe that is directly connected to the exhaust aperture of the exhaust box.

One embodiment of a system to capture residual corrosive gas originating from an exit load lock compartment of a semiconductor etcher located within a clean room in accordance with the present invention is described below. The exhaust system includes an exhaust box having an intake slot, an exhaust aperture and a hollow interior space. The intake slot of the exhaust box is adjacently located to the exit load lock compartment of the semiconductor etcher to receive the residual corrosive gas into its hollow interior space. The intake slot has an edge that is parallel to an outer side edge of the exit load lock compartment when a door of the exit load lock compartment is open. Furthermore, the exhaust system also includes an exhaust blower connected to the exhaust aperture of the exhaust box. The exhaust blower provides suction power to the exhaust box for drawing the residual corrosive gas from the exit load lock compartment through the intake slot into its hollow interior space and through the exhaust aperture to travel outside of the clean room. By removing the corrosive gas as described above, the present invention drastically reduces the corrosive effects on the mechanical and electrical components of the semiconductor etching apparatus and advantageously increases the useful life of the etcher.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

In the following detailed description of the present invention, a system for exhausting residual corrosive gas from an exit load lock compartment of a semiconductor etcher, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
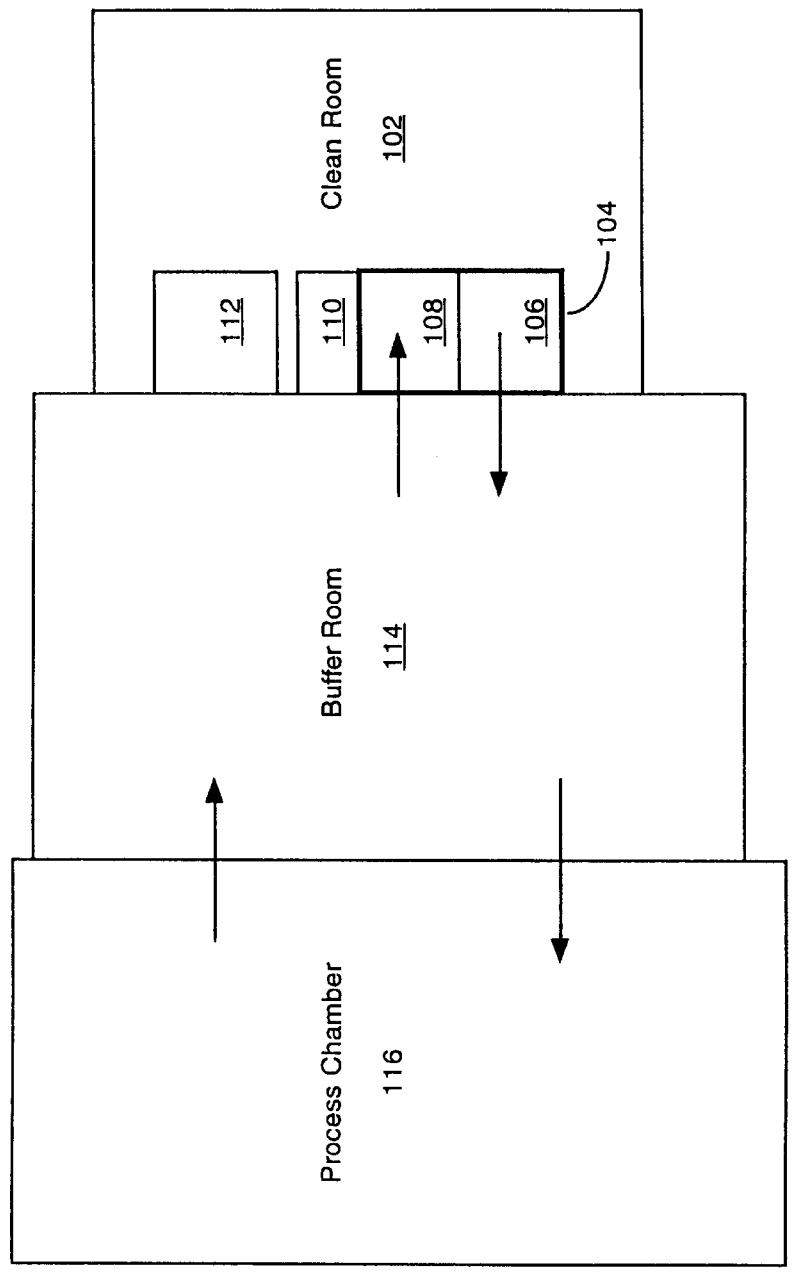
FIG. 1 illustrates a general overview of a system used for etching semiconductor wafers in which the present invention operates.

The present invention operates within a system used for etching semiconductor wafers. The process of etching semiconductor wafers involves complex and technical facilities. FIG. 1 illustrates a general overview of a system 100 used for etching semiconductor wafers in which the present invention operates. The three main rooms which are used within system 100 for etching semiconductor wafers include a clean room 102, a buffer room 114 and a process chamber 116. Located within the clean room 102 are etcher 104, the control computer system 112 and an embodiment of an exhaust box 110 in accordance with the present invention. The control computer system 112 is an integral component of etcher 104 which is electrically coupled to control the operation of etcher 104. One embodiment of control computer system 112 and etcher 104 is a Hitachi M216A Etcher, however the present invention is well suited for application with a number of various semiconductor etchers.

In order for semiconductor wafers to be etched within system 100 of FIG. 1, they are inserted into cassettes that are then loaded into the entrance load lock compartment 106 of etcher 104, which is located within clean room 102. Once the cassettes are loaded, the door of the entrance load lock compartment 106 is closed and then the pressure within the entrance load lock compartment 106 is decreased to establish a vacuum (e.g., about 20 millitorr). Mechanical devices remove the cassettes containing the semiconductor wafers from the entrance load lock compartment 106 and transport them into the buffer room 114. While the cassettes are located within buffer room 114, a mechanical device removes a semiconductor wafer from a cassette and transports it into the process chamber 116.

While within the process chamber 116 of FIG. 1, the semiconductor wafer is etched with a very corrosive gas (e.g., chlorine gas). When the etching of a wafer is complete, the wafer is transported back into the cassette located within the buffer room 114. Each semiconductor wafer contained within the cassettes is transported from the buffer room 114 into the process chamber 116 to be etched and then returned to the buffer room 114. When all the semiconductor wafers within the cassettes have all been etched, the cassettes are then transported into the exit load lock compartment 108 of etcher 104 of FIG. 1.

The doors of the exit load lock compartment 108 of FIG. 1 are closed when the cassettes arrive because the buffer room 114 and the process chamber 116 are under a vacuum at this point of the process. When all the etched semiconductor wafers are located within the exit load lock compartment 108, etcher 104 begins to flow nitrogen gas into the exit load lock compartment 108. As the nitrogen gas flows into the exit load lock compartment 108, the pressure within it increases from about 20 millitorr to about 760 torr or 1 atmosphere. When the pressure within the exit load lock compartment 108 reaches about 1 atmosphere, the residual corrosive gas existing within the exit load lock compartment 108 begins to escape. The escaping residual corrosive gas is then drawn directly into exhaust box 110 of the present invention which advantageously removes it from clean room 102. When the door of the exit load lock compartment 108 is opened in order to allow the removal of the cassettes containing the etched semiconductor wafers, exhaust box 110 also advantageously removes the remaining residual corrosive gas from the exit load lock compartment 108.

Figure 2:
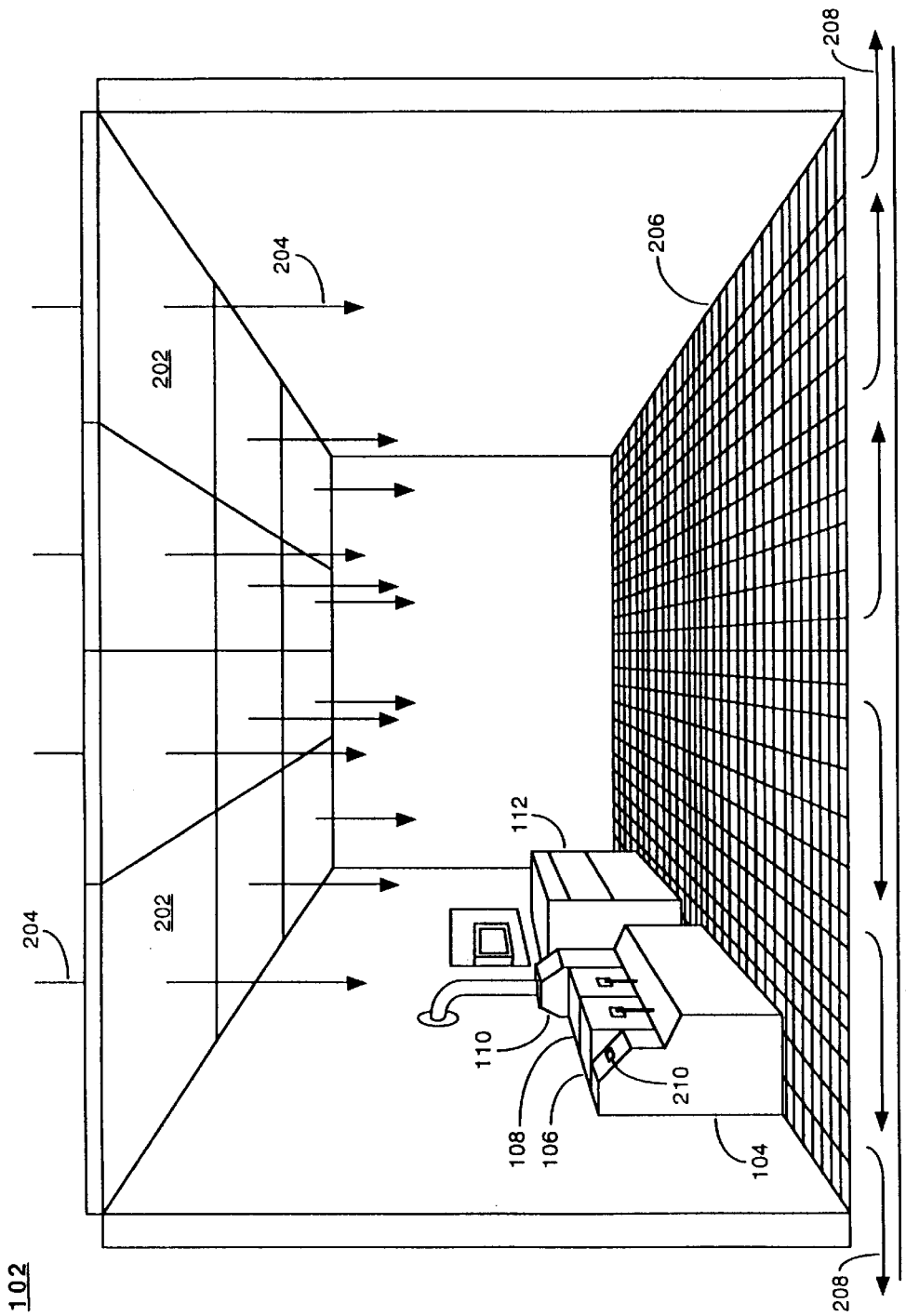
FIG. 2 illustrates an embodiment of a clean room of a system used for etching semiconductor wafers in which the present invention operates.

FIG. 2 illustrates an embodiment of clean room 102 of FIG. 1 that is used for etching semiconductor wafers in which the present invention operates. Laminar flow is a well known system utilized to keep the air within clean room 102 extremely clean. As part of the laminar flow system, the ceiling of the clean room 102 is completely covered with air filters 202. Air 204 is blown into the clean room 102 at a high velocity in the down direction through all of the air filters 202. The floor 206 is a grate enabling the air 204 moving in the downward direction to flow through it and eventually exit clean room 102, as represented by arrows 208. The etcher 104 and control computer 112 are both supported by the grate 206.

The high velocity of air 204 of FIG. 2 from the laminar flow exerts a downward force on everything within the clean room 102. One embodiment of exhaust box 110 within the present invention is designed to overcome the laminar flow of air 204 within the clean room 102 while exhausting residual corrosive gas escaping from the exit load lock compartment 108 as its door is opening. In accordance with the present invention the exhaust box 110 is adjacently located to the exit load lock compartment 108 in order to facilitate the proper exhausting of the residual corrosive gas.

One embodiment of etcher 104 of FIG. 2 is manufactured with two push button switches. Push button switch 210 represents one of these two push button switches while the other push button switch is not shown. In this embodiment the purpose for originally installing the two push button switches on etcher 104 is to enable an operator of etcher 104 to manually pump or vent both the entrance load lock compartment 106 and the exit load lock compartment 108. Both of the push button switches perform the same function, but are located in different areas of etcher 104. Push button switch 210 is located on a panel to the left of the entrance load lock compartment 106 of etcher 104, while the other push button switch is located on a panel to the right of the exit load lock compartment 108. Since the exhaust box 110 is adjacently located to the right of exit load lock compartment 108, the push button switch located on that side can either be removed from etcher 104 or for purposes of convenience can be installed into a side panel of exhaust box 110, which will be discussed later in detail with respect to FIG. 6.

Figure 3:
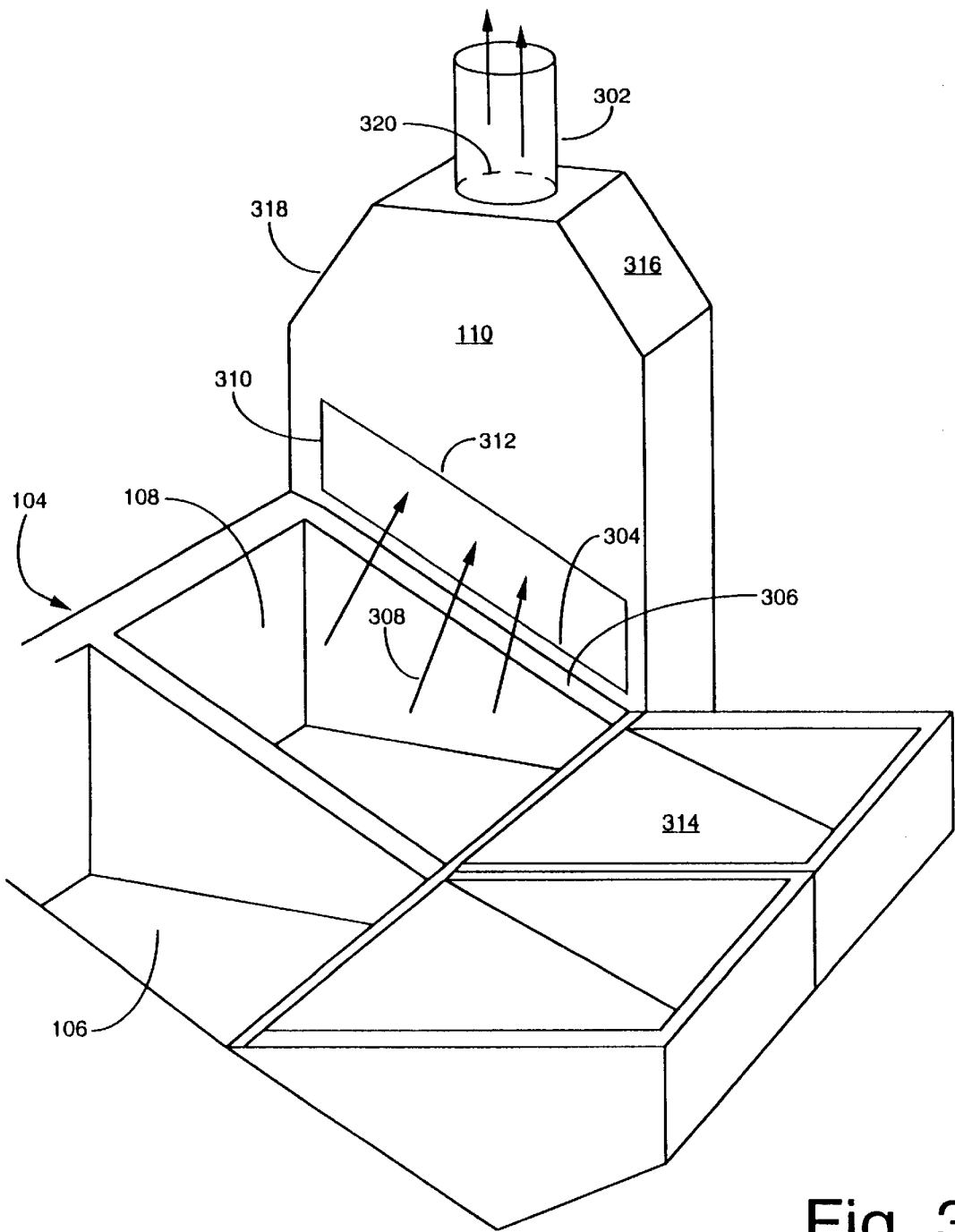
FIG. 3 illustrates an embodiment of an exhaust box within the present invention adjacently located to the exit load lock compartment of a semiconductor etcher in order to exhaust residual corrosive gas.

FIG. 3 illustrates an embodiment of an exhaust box 110 in accordance with the present invention. Exhaust box 110 is adjacently located to the exit load lock compartment 108 of semiconductor etcher 104 in order to remove residual corrosive gas 308. Exhaust box 110 is a specifically shaped hollow box that has an intake slot 310 for receiving residual corrosive gas 308 into its interior space from the exit load lock compartment 108 when the door 314 is opening or in an open position. The suction force that draws the residual corrosive gas 308 through the intake slot 310 is provided through the exhaust pipe 302 that is connected to the exhaust aperture 320 of the exhaust box 110. Any of a number of well known exhaust facilities can be used to provide the suction force required by the present invention.

One of the critical features of the exhaust box 110 of FIG. 3 is the slope of edges 304 and 312 that in part form intake slot 310. It is important that edges 304 and 312 substantially match the slope of the outer side edge 306 of the exit load lock compartment 108 when door 314 is in the open position as shown. In one embodiment of the present invention, edges 304 and 312 of intake slot 310 are parallel to the outer side edge 306 of exit load lock compartment 108. In one embodiment of the present invention, the slope of both edges 304 and 312 is 19.66 degrees above a horizontal axis. However, many other slope values for edges 304 and 312 can also be used to fabricate intake slot 310. Another characteristic of intake slot 310 is that it extends substantially the entire length of the exit load lock compartment 108 thereby enabling the exhaust box 110 to draw in the residual corrosive gas 308 from as much of the exit load lock compartment 108 as possible. Another characteristic of the exhaust box 110 of the present invention is that side panels 316 and 318 are angled towards exhaust pipe 302 in order to magnify the force of suction within exhaust box 110 and through intake slot 310.

When one embodiment of exhaust box 110 of FIG. 3 is operating in accordance with the present invention, the suction force provided to exhaust box 110 draws the residual corrosive gas 308 through intake slot 310 into its interior from exit load lock compartment 108 when door 314 is opening or in the open position. The suction power further draws the residual corrosive gas 308 through the hollow interior of exhaust box 110 and through exhaust aperture 320. Furthermore, the suction power draws the residual corrosive gas 308 through exhaust pipe 302 to an area located outside of clean room 102 of FIG. 2 to be properly released.

Figure 4:
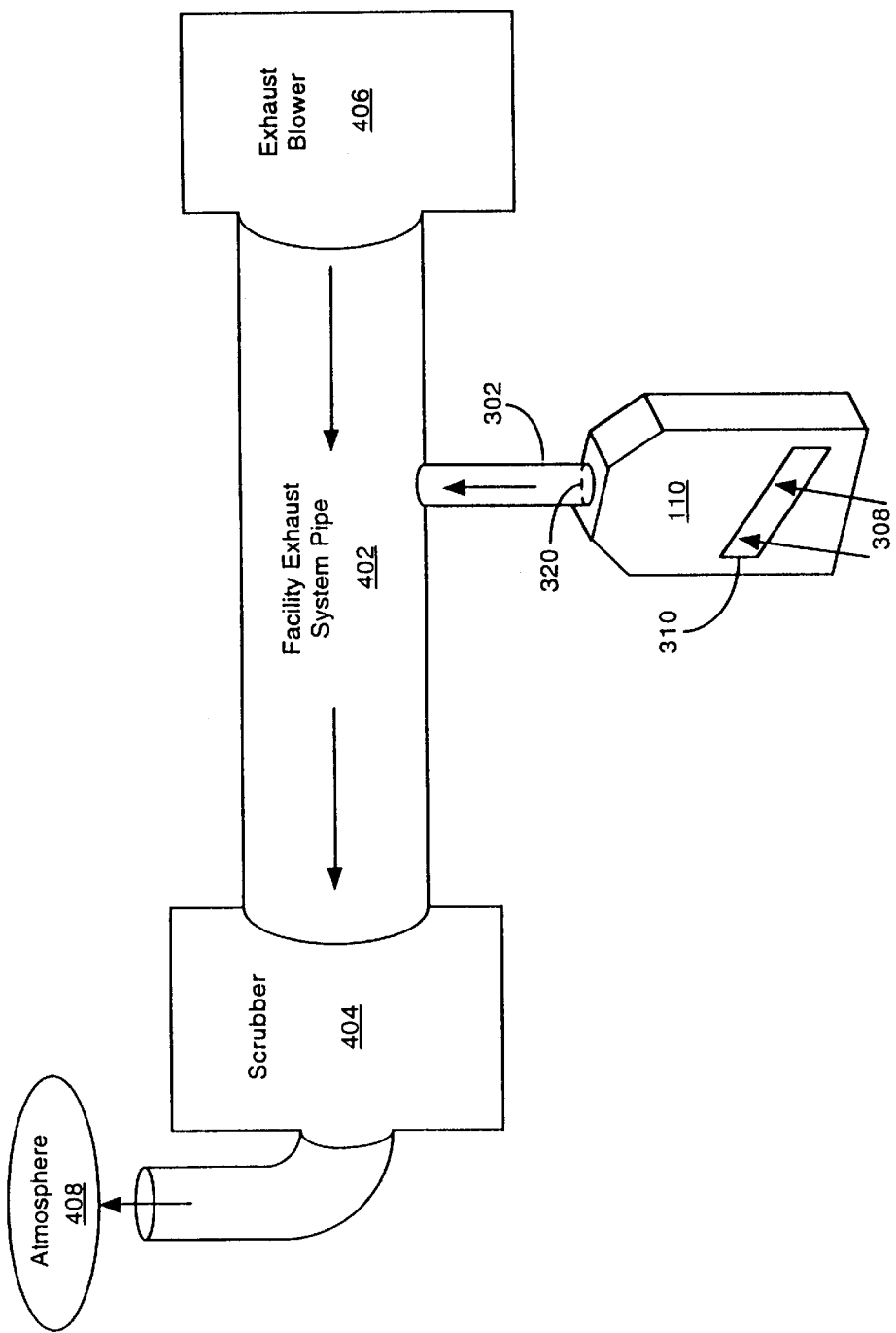
FIG. 4 illustrates an exhaust configuration of an embodiment of the present invention with the exhaust box of the present invention connected to the facility exhaust system of a semiconductor manufacturer.

FIG. 4 illustrates an exhaust configuration of an embodiment of the present invention where the exhaust box 110 of the present invention is connected to a facility exhaust system of a semiconductor manufacturer. Exhaust box 110 is connected to a facility exhaust system in order to provide it with the suction power to draw in the residual corrosive gas 308 from the exit load lock compartment 108 of FIG. 3 when its door 314 is opening. To provide suction power to exhaust box 110, exhaust pipe 302 is connected to the exhaust aperture 320 of exhaust box 110. In one embodiment of the present invention, exhaust pipe 302 is a stainless steel pipe. However, exhaust pipe 302 can also be made of many types of non-corrosive materials. The exhaust pipe 302 is then connected to a facility exhaust system pipe 402. Significant and continuous exhaust power is provided to the facility exhaust system pipe by exhaust blower 406, which in turn creates significant and continuous suction power within exhaust box 110.

The significant and continuous suction power created by exhaust blower 406 of FIG. 4 causes the residual corrosive gas 308 to be drawn into the exhaust box 110 through intake slot 310. The suction power of blower 406 causes the residual corrosive gas 308 to travel through exhaust box 110 and exhaust pipe 302 into the facility exhaust system pipe 402. The facility exhaust system pipe 402 is connected to the scrubber 404. The exhaust blower 406 causes the residual corrosive gas 308 to travel through the facility exhaust system pipe 402 into scrubber 404. Scrubber 404 cleanses the residual corrosive gas 308 of any dangerous or toxic contents and then exhausts it into the atmosphere 408.

Figure 5:
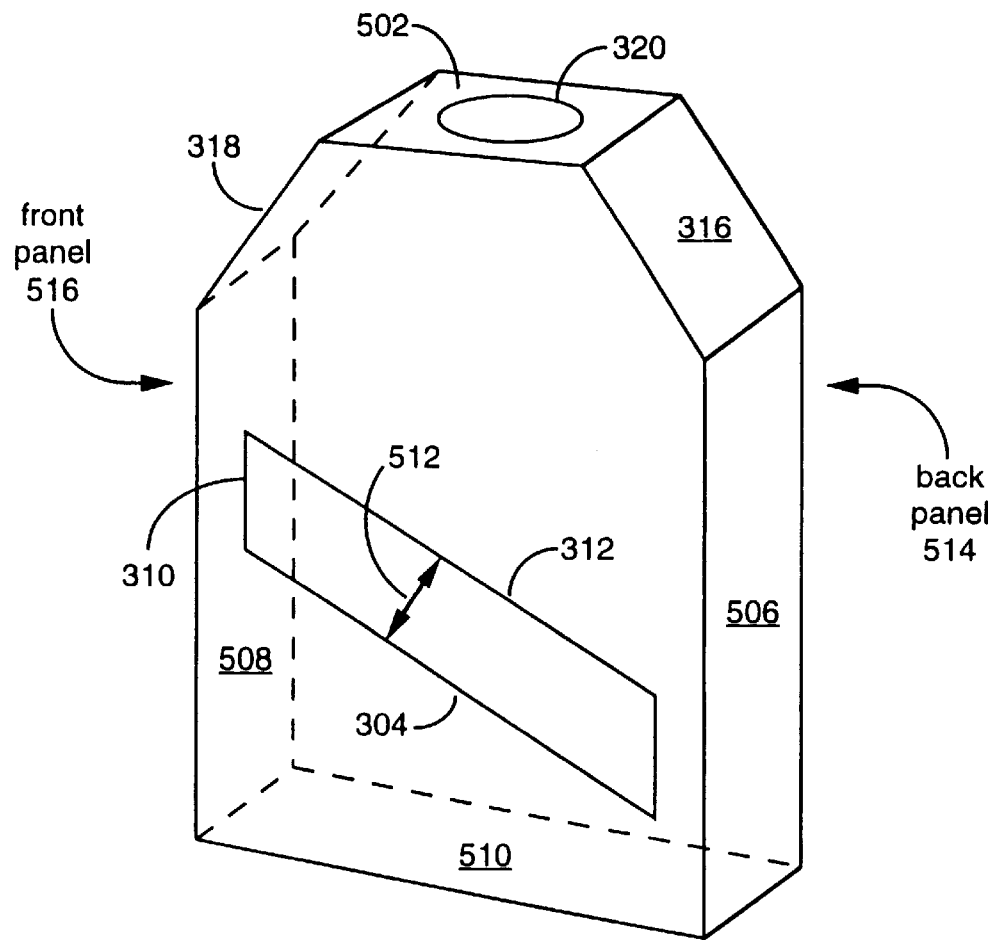
FIG. 5 illustrates one embodiment of an exhaust box in accordance with the present invention which removes the residual corrosive gas from the exit load lock compartment of a semiconductor etcher.

FIG. 5 illustrates one embodiment of an exhaust box 110 in accordance with the present invention which removes the residual corrosive gas 308 of FIG. 3 from the exit load lock compartment 108 while its door 314 is opening. Exhaust box 110 is fabricated from non-corrosive material so that it is unaffected by the presence of the residual corrosive gas 308. One embodiment of exhaust box 110 within the present invention is fabricated from PLEXIGLASS acrylic (PLEXIGLASS is a registered trademark of Rohm and Hass Co.), stainless steel or plastic.

There are several different components that are combined in the construction of the exhaust box 110 of FIG. 5. For instance, two of the several components used to construct exhaust box 110 are the upper side panels 316 and 318, which both have the same physical dimensions within one embodiment of the present invention. In one embodiment of the present invention, upper side panels 316 and 318 each have a width of 4.75 inches, a length of 6.75 inches and a depth equal to the thickness of the non-corrosive material from which it is fabricated. However, many other physical dimensions can also be used to fabricate upper side panels 316 and 318. Another two components also used to construct exhaust box 110 are the side panels 506 and 508, which both have the same physical dimensions within one embodiment of the present invention. In one embodiment of the present invention, side panels 506 and 508 each have a width of 4.75 inches, a length of 13 inches and a depth equal to the thickness of the non-corrosive material from which it is fabricated. However, many other physical dimensions can also be used to fabricate side panels 506 and 508.

Another component also used in the construction of the exhaust box 110 of FIG. 5 is the bottom panel 510. In one embodiment of the present invention, the bottom panel 510 has a width of 4.75 inches, a length of 10.75 inches and a depth equal to the thickness of the non-corrosive material from which it is fabricated. However, many other physical dimensions can also be used to fabricate bottom panel 510. Another component also used to construct exhaust box 110 is the top panel 502 which has an exhaust aperture 320 through it. In one embodiment of the present invention, top panel 502 has a width of 4.75 inches, a length of 5.5 inches and a depth equal to the thickness of the non-corrosive material from which it is fabricated. However, many other physical dimensions can also be used to fabricate top panel 502. In one embodiment of the present invention, aperture 320 has a circular shape with a diameter of 3 inches which is centrally located through top panel 502. However, many other physical dimensions can also be used to fabricate aperture 320. Another component also used in the construction of the exhaust box 110 is the back panel 514. In one embodiment of the present invention, the back panel 514 has a bottom width of 10.75 inches, a top width of 5.5 inches, an overall length of 19.219 inches and a depth equal to the thickness of the non-corrosive material from which it is fabricated. However, many other physical dimensions can also be used to fabricate back panel 514.

Furthermore, another component used in the construction of the exhaust box 110 of FIG. 5 is the front panel 516 which has an intake slot 310. In one embodiment of the present invention, front panel 516 has the same physical dimensions as back panel 514 described above. However, many other physical dimensions can also be used to fabricate front panel 516. The physical dimensions of intake slot 310 are dependent on the physical dimensions of the exit load lock compartment 108 of FIG. 3 of etcher 104. The slope of edges 304 and 312 of intake slot 310 substantially match the slope of the outer side edge 306 of the exit load lock compartment 108 when door 314 is in the open position. In one embodiment of the present invention, edges 304 and 312 of intake slot 310 are parallel to the outer side edge 306 of the exit load lock compartment 108 when door 314 is in the open position. The distance 512 located between edges 304 and 312 is proper when the residual corrosive gas 308 is able to aerodynamically flow through intake slot 310.

If the distance 512 of FIG. 5 is too large, the suction power of exhaust box 110 is diminished and becomes ineffective for drawing the residual corrosive gas 308 through intake slot 310. Conversely, if the distance 512 is too small, the suction power of exhaust box 110 is greatly increased causing the residual corrosive gas 308 to have turbulence and not flow smoothly through intake slot 310. In one embodiment of the present invention, the distance 512 is equal to 2 inches where edges 304 and 312 of intake slot 310 each have a length of 9.29 inches at a slope of 19.66 degrees above a horizontal axis. However, many other physical dimensions and slope values can also be used to fabricate intake slot 310.

Figure 6:
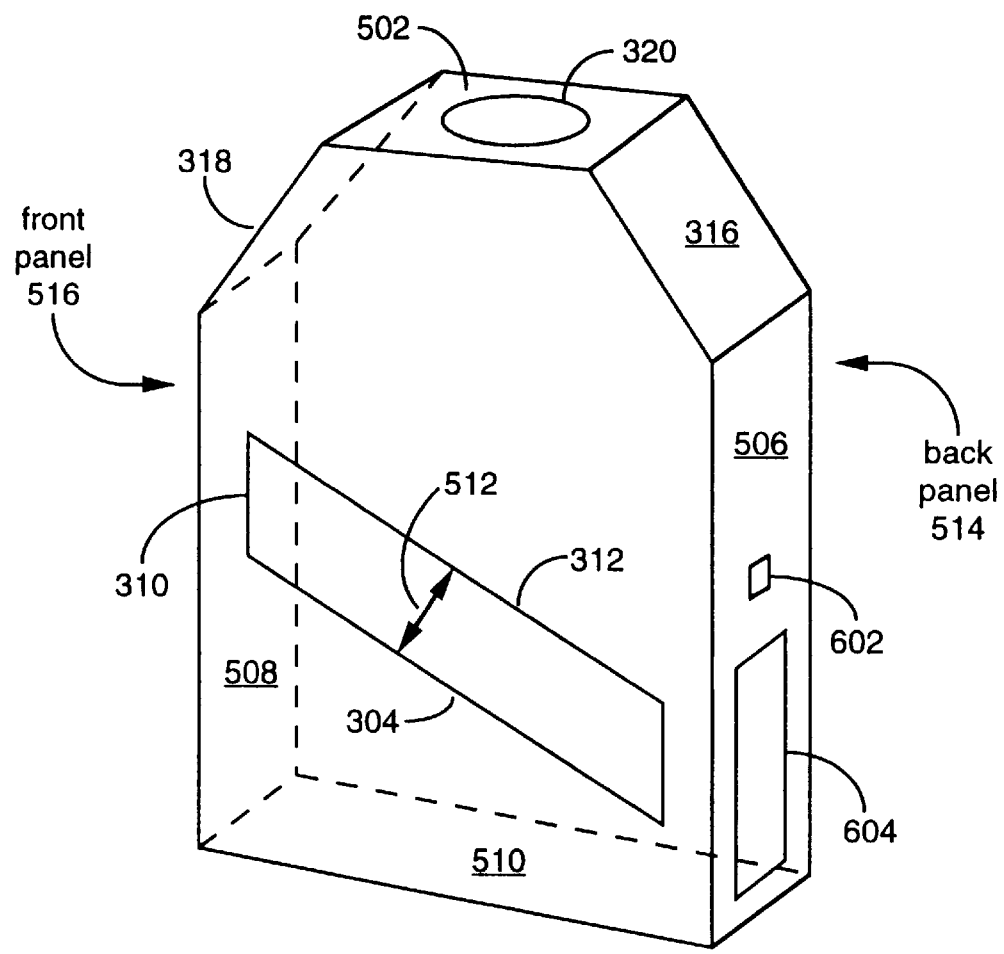
FIG. 6 illustrates another embodiment of an exhaust box in accordance with the present invention which removes the residual corrosive gas from the exit load lock compartment of a semiconductor etcher.

FIG. 6 illustrates another embodiment of an exhaust box 600 in accordance with the present invention which removes the residual corrosive gas 308 of FIG. 3 from the exit load lock compartment 108 while its door 314 is opening. Exhaust box 600 has many of the same physical attributes as exhaust box 110 of FIG. 5. The main difference that distinguishes exhaust box 600 from exhaust box 110 pertains to side panel 506. Side panel 506 of exhaust box 600 has been installed with a push button switch 602 and a service door 604.

Push button switch 602 of FIG. 6 represents the push button switch that is originally located on etcher 104 of FIG. 2 on a panel to the right of the exit load lock compartment 108. Since the exhaust box 600 of the present invention is adjacently located to the right of exit load lock compartment 108, the push button switch 602 located on that side of etcher 104 can either be removed or for the purpose of convenience installed into side panel 506 of exhaust box 600. Push button switch 602 represents the push button switch of etcher 104 installed within side panel 506 of exhaust box 600.

To facilitate ready installation and replacement of the push button switch 602 of FIG. 6 of exhaust box 600, a service door 604 can be installed within side panel 506. By opening or removing the service door 604 of side panel 506, an aperture into the interior of exhaust box 600 is produced. In one embodiment of the present invention, the service door 604 is attached to side panel 506 using non-corrosive metal screws. However, many other ways can also be used to attach the service door 604 to side panel 506. In one embodiment of the present invention, service door 604 has a width of 3.5 inches, a length of 6 inches and a depth equal to the thickness of the non-corrosive material from which it is fabricated. However, many other physical dimensions can also be used to fabricate service door 604.

By removing the residual corrosive gas 308 of FIG. 3 from the exit load lock compartment 108 using suction action as described above, the present invention drastically reduces the corrosive effects on the mechanical and electrical components of the semiconductor etching apparatus and advantageously increases the useful life of etcher 104.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A system for capturing residual corrosive gas from an exit load lock compartment of a semiconductor etcher located within a clean room, said system comprising:

an exhaust box having an intake slot, an exhaust aperture and a hollow interior space, said intake slot adjacently located to said exit load lock compartment of said semiconductor etcher for capturing said residual corrosive gas into said hollow interior space;

wherein said intake slot has an edge that is parallel to an outer side edge of said exit load lock compartment; and an exhaust blower connected to said exhaust aperture of said exhaust box to provide suction power to said exhaust box for drawing said residual corrosive gas from said exit load lock compartment through said intake slot into said hollow interior space and through said exhaust aperture and outside of said clean room.

2. A system as described in claim 1 wherein a dimension of said intake slot matches the length of said outer side edge of said exit load lock compartment of said semiconductor etcher.

3. A system as described in claim 1 wherein said residual corrosive gas is chlorine gas and wherein said exhaust blower is for providing suction power to said exhaust box for drawing said chlorine gas from said exit load lock compartment through said intake slot into said hollow interior space and through said exhaust aperture and outside of said clean room.

4. A system as described in claim 1 wherein said exhaust box is fabricated from a non-corrosive material that is unaffected by said residual corrosive gas.

5. A system as described in claim 4 wherein said non-corrosive material is acrylic.

6. A system as described in claim 4 wherein said non-corrosive material is stainless steel.

7. A system as described in claim 4 further comprising an exhaust pipe connected between said exhaust aperture of said exhaust box and said exhaust blower, said exhaust pipe transporting said residual corrosive gas outside of said clean room.

8. A system as described in claim 7 wherein said exhaust box further comprises a switch electrically coupled to said semiconductor etcher for manually venting and pumping of said exit load lock compartment.

9. A system as described in claim 8 wherein said exhaust box further comprises a service door for providing access to said hollow interior space of said exhaust box.

10. A system for capturing residual corrosive gas from an exit load lock compartment of a semiconductor etcher located within a clean room, said system comprising:

an exhaust box having an intake slot, an exhaust aperture and a hollow interior space, said intake slot adjacently located to said exit load lock compartment of said semiconductor etcher for capturing said residual corrosive gas into said hollow interior space;

wherein said intake slot has an edge that is parallel to an outer side edge of said exit load lock compartment;

wherein said exhaust box is fabricated from a non-corrosive material that is unaffected by said residual corrosive gas;

an exhaust pipe connected to said exhaust aperture of said exhaust box; and an exhaust blower connected to said exhaust pipe to provide suction power to said exhaust box for drawing said residual corrosive gas from said exit load lock compartment through said intake slot into said hollow interior space and through said exhaust pipe and outside of said clean room.

11. A system as described in claim 10 wherein a dimension of said intake slot matches the length of said outer side edge of said exit load lock compartment of said semiconductor etcher.

12. A system as described in claim 10 wherein said non-corrosive material is acrylic.

13. A system as described in claim 10 wherein said exhaust box further comprises a side panel angled towards said exhaust pipe to magnify said suction power of said exhaust box.

14. A system as described in claim 10 wherein said exhaust box further comprises a switch electrically coupled to said semiconductor etcher for manually venting and pumping of said exit load lock compartment.

15. A system as described in claim 14 wherein said exhaust box further comprises a service door for providing access to said hollow interior space of said exhaust box.

16. A system for capturing residual corrosive gas, said system comprising:

an exit load lock compartment of a semiconductor etcher located within a clean room, said exit load lock compartment having said residual corrosive gas therein;

an exhaust box having an intake slot, an exhaust aperture and a hollow interior space, said intake slot adjacently located to said exit load lock compartment of said semiconductor etcher for capturing said residual corrosive gas into said hollow interior space;

wherein said intake slot has an edge that is parallel to an outer side edge of said exit load lock compartment;

an exhaust pipe connected to said exhaust aperture of said exhaust box, a facility exhaust system pipe connected to said exhaust pipe;

a scrubber device connected to said facility exhaust system pipe, said scrubber for cleaning said residual corrosive gas for release into the atmosphere; and an exhaust blower connected to said facility exhaust system pipe for providing suction to said exhaust box for drawing said residual corrosive gas from said exit load lock compartment through said intake slot into said hollow interior space, through said exhaust pipe, through said facility exhaust system pipe and into said scrubber.

17. A system as described in claim 16 wherein a dimension of said intake slot matches the length of said outer side edge of said exit load lock compartment of said semiconductor etcher.

18. A system as described in claim 16 wherein said exhaust box is fabricated from a non-corrosive material that is unaffected by said residual corrosive gas.

19. A system as described in claim 18 wherein said exhaust box further comprises a switch electrically coupled to said semiconductor etcher for manually venting and pumping of said exit load lock compartment.

20. A system as described in claim 19 wherein said exhaust box further comprises a service door for providing access to said interior space of said exhaust box.

* * * * *